(12) United States Patent
Jeong

(10) Patent No.: US 7,369,428 B2
(45) Date of Patent: May 6, 2008

(54) METHODS OF OPERATING A MAGNETIC RANDOM ACCESS MEMORY DEVICE AND RELATED DEVICES AND STRUCTURES

(75) Inventor: Won-Cheol Jeong, Seoul (KR)

(73) Assignee: Samsung Electronics Co., Ltd., Geonggi-do (KR)

( * ) Notice: Subject to any disclaimer, the term of this patent is extended or adjusted under 35 U.S.C. 154(b) by 74 days.

(21) Appl. No.: 11/284,546

(22) Filed: Nov. 22, 2005

(65) Prior Publication Data

US 2006/0083054 A1    Apr. 20, 2006

Related U.S. Application Data

(63) Continuation-in-part of application No. 11/201,495, filed on Aug. 11, 2005, now Pat. No. 7,164,598, and a continuation-in-part of application No. 11/092,362, filed on Mar. 29, 2005, and a continuation-in-part of application No. 10/795,600, filed on Mar. 8, 2004, now Pat. No. 7,092,283.

(30) Foreign Application Priority Data

| Sep. 29, 2003 | (KR) | .................................. 0067530 |
| Jul. 14, 2004 | (KR) | .................................. 0054939 |
| Aug. 12, 2004 | (KR) | ....................................... 63641 |
| Jan. 25, 2005 | (KR) | ..................... 10-2005-0006846 |

(51) Int. Cl.
*G11C 11/00* (2006.01)
*G11C 11/14* (2006.01)

(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS 6,097,625 A * 8/2000 Scheuerlein ................. 365/171

(Continued)

FOREIGN PATENT DOCUMENTS

JP    2001-084757    3/2001

(Continued)

OTHER PUBLICATIONS

Boeck et al. "Spintronics, a New Nanoelectronics Adventure" thinfilmmfg.com 5 pages (2002) <http://www.thinfilmmfg.com/subscribers/Subscriber02/spin1May02.htm> Accessed online May 20, 2005.

(Continued)

*Primary Examiner*—Trong Phan
(74) *Attorney, Agent, or Firm*—Myers, Bigel, Sibley & Sajovec, P.A.

(57) ABSTRACT

A magnetic random access memory (MRAM) device may include a magnetic tunnel junction structure between first and second electrodes. Methods of operating such as MRAM device may include providing a write current through the first electrode, through the magnetic tunnel junction structure, and through the second electrode. An auxiliary switching magnetic field may be generated by the write current through the first electrode, and a portion of the auxiliary switching magnetic field may pass through the magnetic tunnel junction structure in a direction perpendicular to a direction of the write current through the magnetic tunnel junction structure. Moreover, a magnitude of the write current and/or the auxiliary switching magnetic field may be sufficient to change a program state of the magnetic tunnel junction structure. Related devices and structures are also discussed.

36 Claims, 9 Drawing Sheets

U.S. PATENT DOCUMENTS

| | | | |
|---|---|---|---|
| 6,130,814 A | 10/2000 | Sun | |
| 6,163,477 A | 12/2000 | Tran | |
| 6,236,590 B1 | 5/2001 | Bhattacharyya et al. | |
| 6,385,082 B1 | 5/2002 | Abraham et al. | |
| 6,385,083 B1 | 5/2002 | Sharma et al. | |
| 6,430,085 B1 | 8/2002 | Rizzo | |
| 6,509,621 B2 | 1/2003 | Nakao | |
| 6,545,906 B1 | 4/2003 | Savtchenko et al. | |
| 6,560,135 B2 | 5/2003 | Matsuoka et al. | |
| 6,603,677 B2 | 8/2003 | Redon et al. | |
| 6,603,678 B2 | 8/2003 | Nickel et al. | |
| 6,680,862 B2 * | 1/2004 | Hidaka | 365/158 |
| 6,720,597 B2 | 4/2004 | Janesky et al. | |
| 6,724,651 B2 | 4/2004 | Hirai | |
| 6,724,674 B2 | 4/2004 | Abraham et al. | |
| 6,744,651 B2 | 6/2004 | Tang | |
| 6,760,251 B2 * | 7/2004 | Hidaka | 365/171 |
| 6,762,953 B2 | 7/2004 | Tanizaki et al. | |
| 6,771,534 B2 | 8/2004 | Stipe | |
| 6,774,651 B1 | 8/2004 | Hembree | |
| 6,781,874 B2 * | 8/2004 | Hidaka | 365/171 |
| 6,791,874 B2 | 9/2004 | Tran et al. | |
| 6,794,696 B2 | 9/2004 | Fukuzumi | |
| 6,803,619 B2 * | 10/2004 | Hosotani et al. | 365/158 |
| 6,842,361 B2 * | 1/2005 | Miyatke et al. | 365/158 |
| 6,870,757 B2 | 3/2005 | Hidaka | |
| 6,894,919 B2 | 5/2005 | Fukuzumi | |
| 6,898,113 B2 | 5/2005 | Tsuji | |
| 6,909,630 B2 * | 6/2005 | Tsang | 365/158 |
| 6,947,314 B2 * | 9/2005 | Yoda et al. | 365/158 |
| 6,947,315 B2 * | 9/2005 | Iwata | 365/158 |
| 6,952,364 B2 * | 10/2005 | Lee et al. | 365/158 |
| 6,954,374 B2 * | 10/2005 | Hidaka | 365/171 |
| 6,970,378 B2 * | 11/2005 | Hidaka | 365/158 |
| 6,992,924 B2 * | 1/2006 | Miyatake et al. | 365/171 |
| 6,992,935 B2 | 1/2006 | Ooishi | |
| 6,999,340 B2 * | 2/2006 | Shimizu | 365/158 |
| 6,999,341 B2 * | 2/2006 | Ooishi | 365/171 |
| 6,999,342 B2 * | 2/2006 | Ooishi | 365/171 |
| 7,009,873 B2 * | 3/2006 | Yoda et al. | 365/158 |
| 7,009,877 B1 * | 3/2006 | Huai et al. | 365/171 |
| 7,068,536 B2 * | 6/2006 | Matsutera et al. | 365/171 |
| 7,092,283 B2 | 8/2006 | Jeong et al. | |
| 7,095,648 B2 * | 8/2006 | Ditewig et al. | 365/158 |
| 7,105,879 B2 * | 9/2006 | Lin et al. | 365/158 |
| 7,164,598 B2 | 1/2007 | Jeong et al. | |
| 7,206,222 B2 * | 4/2007 | Hidaka | 365/158 |
| 2002/0176277 A1 | 11/2002 | Bessho et al. | |
| 2003/0170976 A1 | 9/2003 | Molla et al. | |
| 2004/0256688 A1 | 12/2004 | Braun | |
| 2005/0073878 A1 | 4/2005 | Hsin-Chu | |
| 2005/0078510 A1 | 4/2005 | Jeong et al. | |
| 2006/0034117 A1 | 2/2006 | Jeong et al. | |

FOREIGN PATENT DOCUMENTS

| | | |
|---|---|---|
| JP | 2001-084758 | 3/2001 |
| JP | 2001-250206 | 9/2001 |
| JP | 2002-319664 | 10/2002 |
| JP | 2004-087519 | 3/2004 |
| KR | 1020020046036 | 6/2002 |
| KR | 2002 0054656 | 7/2002 |
| KR | 1020020054656 | 7/2002 |
| KR | 1020030040027 | 5/2003 |
| KR | 1020030062280 | 7/2003 |
| KR | 1020040003479 | 1/2004 |
| KR | 1020040026619 | 3/2004 |
| KR | 1020040038420 | 5/2004 |
| KR | 1020040041335 | 5/2004 |
| KR | 1020040042917 | 5/2004 |
| WO | 2004/049344 | 6/2004 |

OTHER PUBLICATIONS

Deak "Spin Injection in Thermally Assisted Magnetic Random Access Memory" 15 pages <http://www.nve.com/advpdf/49th_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMs" *EETimes Online* (Jul. 17, 2001) 4 pages <http://www.eetimes.com/story/OEG20010717S0064> Accessed online on Apr. 18, 2005.

Office Action issued by the Korean Intellectual Property Office for Korean Application No. 10-2004-0054939 on Nov. 30, 2005.

* cited by examiner

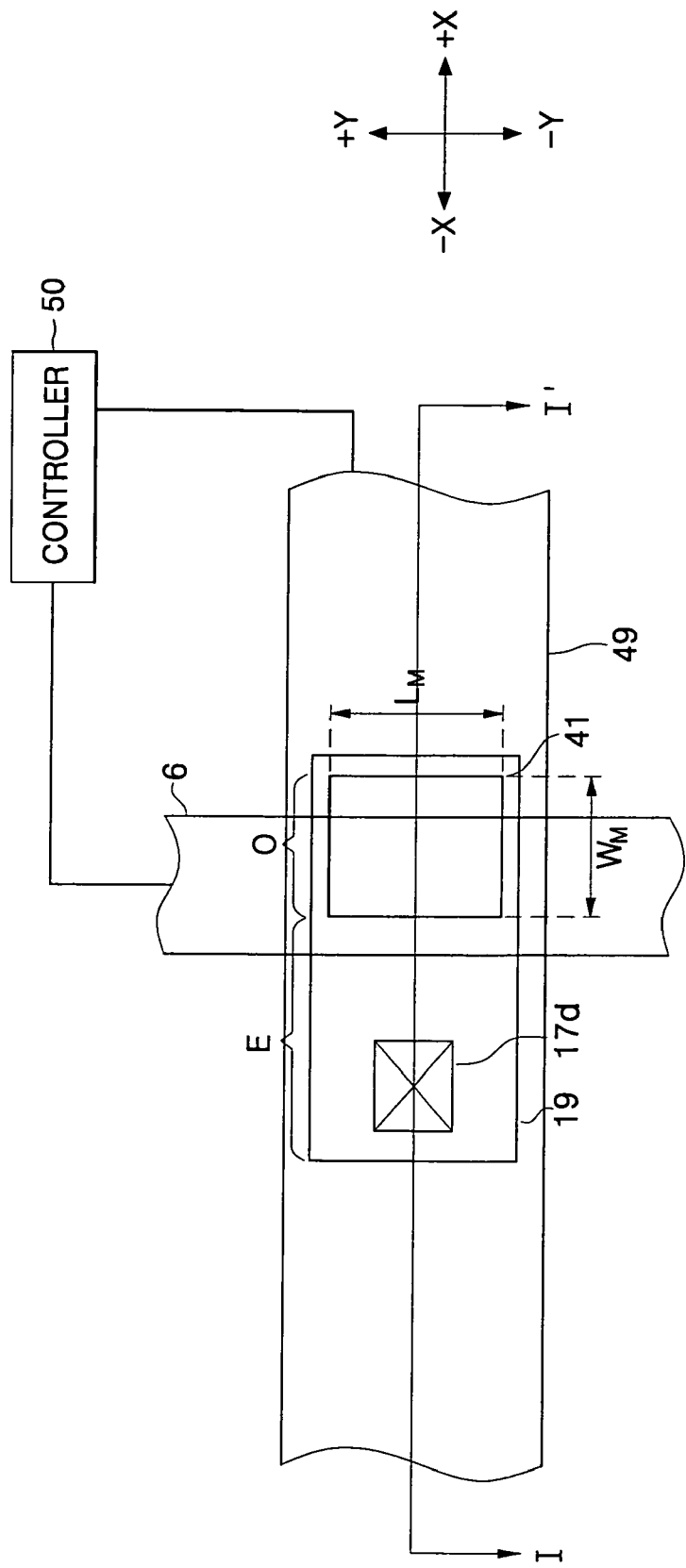

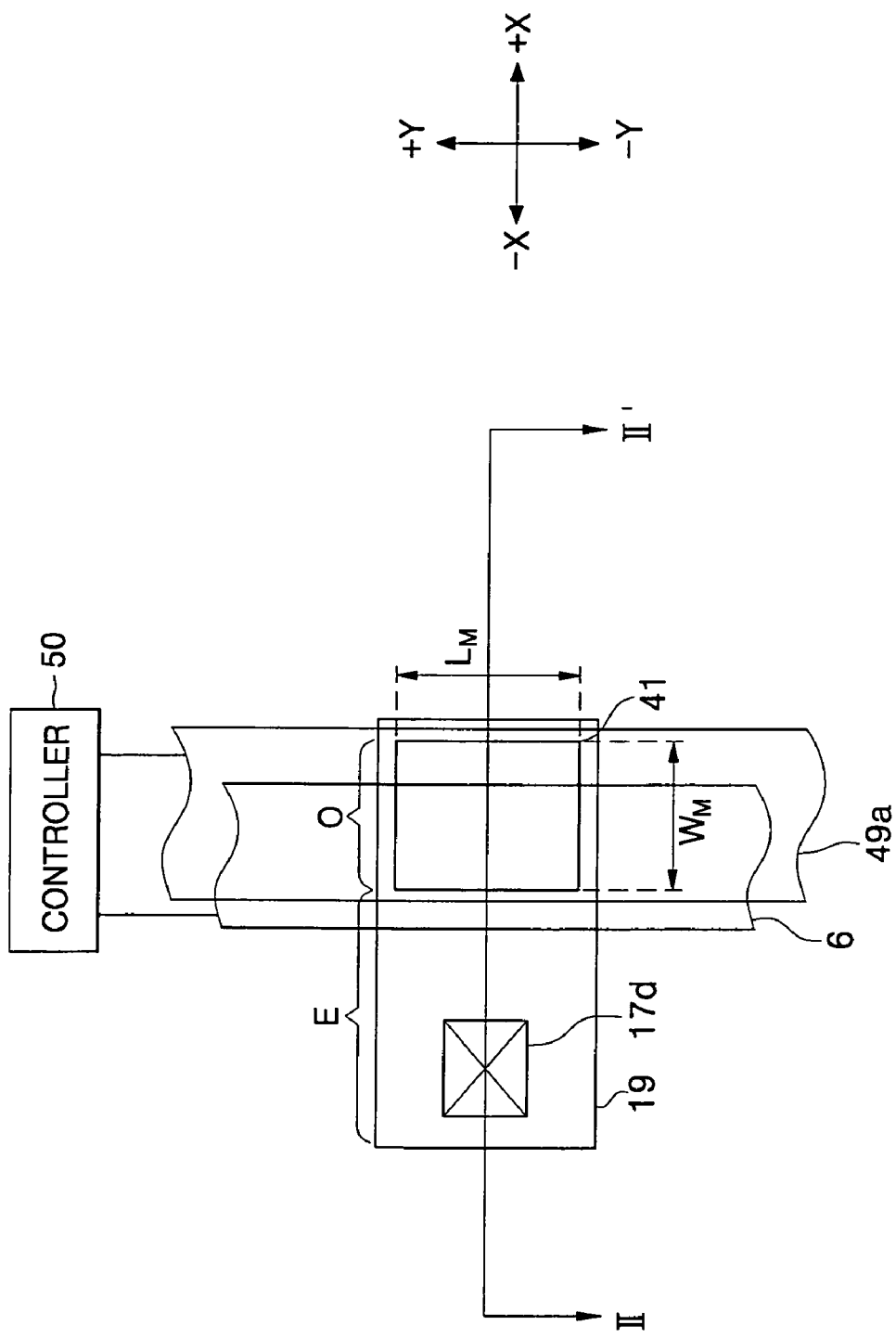

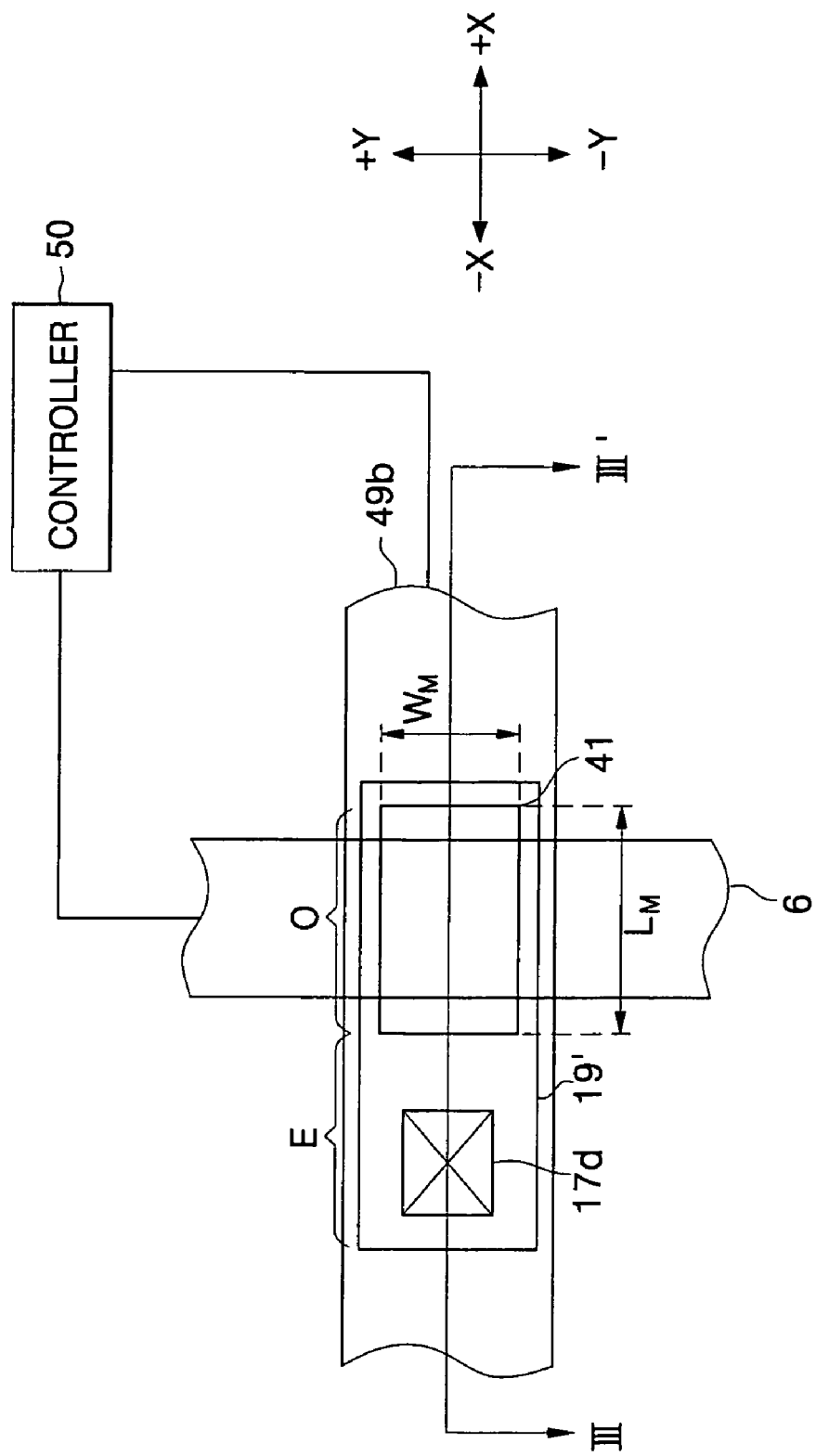

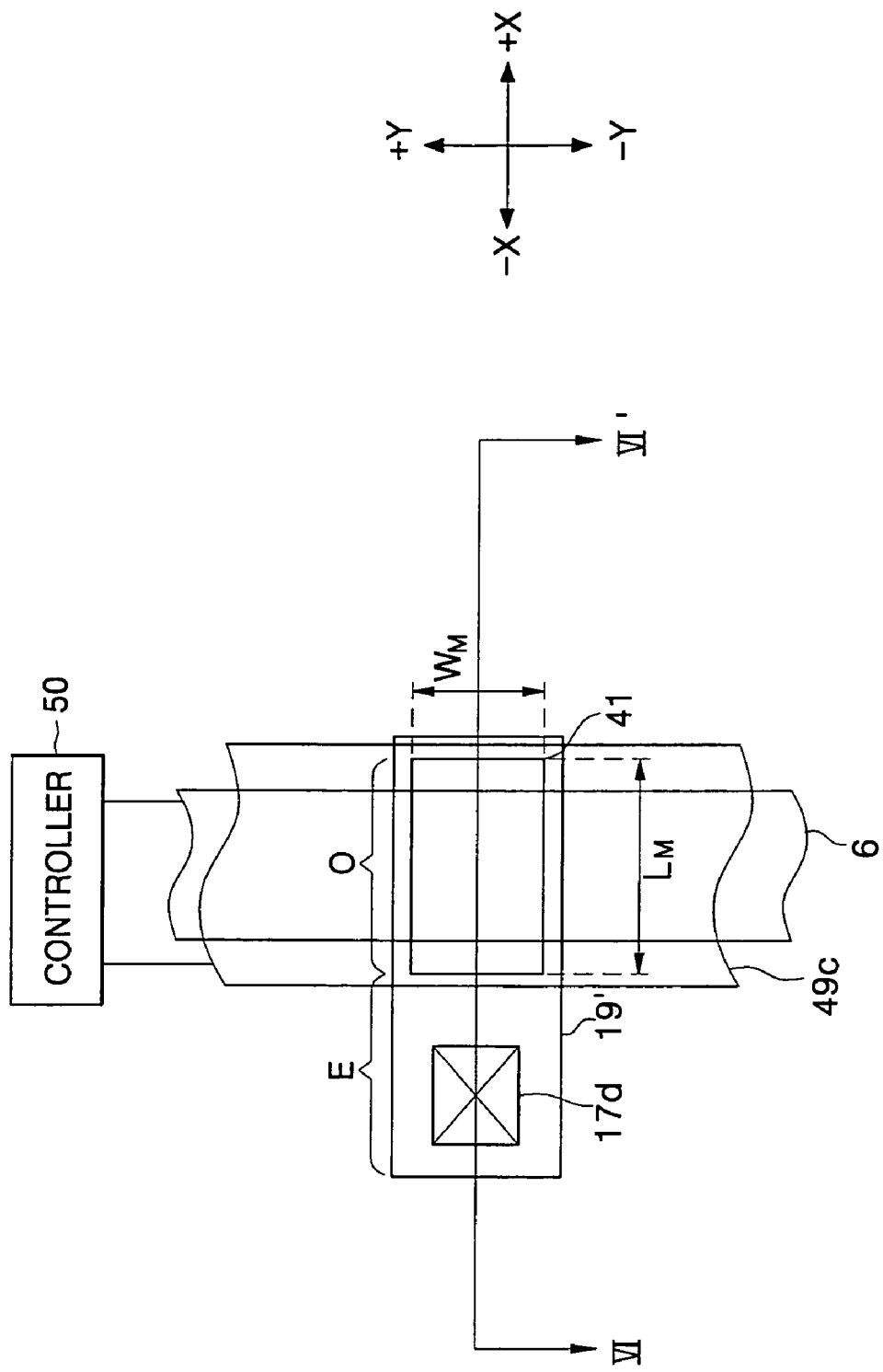

METHODS OF OPERATING A MAGNETIC RANDOM ACCESS MEMORY DEVICE AND RELATED DEVICES AND STRUCTURES

RELATED APPLICATION

This application claims the benefit of priority as a continuation-in-part application of U.S. patent application Ser. No. 10/795,600, filed Mar. 8, 2004 (now issued as U.S. Pat. No. 7,092,283), which claims the benefit of priority from Korean Application No. 2003-0067530, filed Sep. 29, 2003. This application also claims the benefit of priority as a continuation-in-part-application of U.S. patent application Ser. No. 11/092,362, filed Mar. 29, 2005 (now published as U.S. Patent Publication No. 2006/0011958), which claims the benefit of priority from Korean Application No. 2004-0054939, filed Jul. 14, 2004. In addition, this application claims the benefit of priority as a continuation-in-part application of U.S. patent application Ser. No. 11/201,495 filed Aug. 11, 2005 (now issued as U.S. Pat. No. 7,164,598), which claims the benefit of priority from Korean Application No. 2004-63641, filed Aug. 12, 2004. This application also claims the benefit of priority from Korean Patent Application No. 2005-0006846, filed Jan. 25, 2005. The disclosures of each of the above referenced U.S. and Korean patent applications are hereby incorporated herein by reference in their entirety.

FIELD OF THE INVENTION

The present invention relates to semiconductor memory devices and, more particularly, to magnetic random access memory devices.

BACKGROUND

Magnetic random access memory (MRAM) devices have been widely used as non-volatile memory devices that may be operated at relatively low voltages and high speeds. In a unit cell of a MRAM device, data may be stored in a magnetic tunnel junction (MTJ) structure of a magnetic resistor. An MTJ structure may include first and second ferromagnetic layers, and a tunneling insulating layer between the first and second ferromagnetic layers. A magnetic polarization of the first ferromagnetic layer (also referred to as a free layer) may be changed using an external magnetic field applied to the MTJ structure. The external magnetic field may be induced by a current flowing adjacent the MTJ structure, and the magnetic polarization of the free layer may be parallel or antiparallel with respect to a fixed magnetic polarization in the second ferromagnetic layer (also referred to as a pinned layer). The current used to generate the external magnetic field may flow through a conductive layer such as a digit line and/or a bit line disposed adjacent the MTJ structure.

According to spintronics based on quantum mechanics, when magnetic spins in the free layer and the pinned layer are arranged parallel with respect to each other, a tunneling current flowing through the MTJ structure may have a relatively high value. When the magnetic spins in the free layer and the pinned layer are arranged antiparallel with respect to each other, a tunneling current flowing through the MTJ structure may have a relatively low value. Therefore, data stored in a MRAM cell may be determined based on a direction of magnetic spins in the free layer.

When viewed from a plan view, MTJ structures may have a rectangular or elliptical shape because the magnetic spins in the free layer may be in a relatively stable state when they are parallel to a longitudinal direction of the free layer.

An integrated circuit MRAM device may include a plurality of MTJ structures. The plurality of MTJ structures may have non-uniform switching characteristics depending on a fabrication process used. In this case, external magnetic fields used to write desired data in the MTJ structures may be different from one memory cell to another. Therefore, a greater non-uniformity of MTJ structure switching characteristics may result in a lower write margin for a MRAM device. In particular, when an MTJ structure is reduced in size to increase integration density, write margins may be significantly reduced. In other words, during a write operation to selectively store desired data in one of the MTJ structures, undesired data may be written to a non-selected MTJ structure(s) that shares a bit line and/or a digit line electrically associated with the selected MTJ structure. That is, according to conventional writing methods, a write disturbance may occur so that undesired data is stored in the non-selected MTJ structure(s) during an operation used to store data in the selected MTJ structure.

In addition, MRAM devices have been proposed which use a spin injection mechanism to reduce write disturbance and to increase integration density. MRAM devices which use a spin injection mechanism are disclosed for example, in U.S. Pat. No. 6,130,814 entitled "Current-Induced Magnetic Switching Device And Memory Including The Same" by Sun. Additional MRAM devices which use a spin injection mechanism are disclosed in U.S. Pat. No. 6,603,677 B2 entitled "Three-Layered Stacked Magnetic Spin Polarization Device With Memory" by Redon et al. The disclosures of U.S. Pat. No. 6,130,814 and U.S. Pat. No. 6,603,677 are hereby incorporated herein in their entirety by reference.

To switch an MRAM cell using the spin injection mechanism, however, high write current density may be required. In this case, an access transistor such as a MOS transistor should provide a current drive capable of generating high writing currents. That is, when the MRAM cell is programmed using a spin injection mechanism, smaller access transistors may be difficult to provide while maintaining a desired current drive.

SUMMARY

According to some embodiments of the present invention, a magnetic random access memory (MRAM) device may include a magnetic tunnel junction structure between first and second electrodes. Methods of operating such a device may include providing a write current through the first electrode, through the magnetic tunnel junction structure, and through the second electrode wherein an auxiliary switching magnetic field is generated by the write current through the first electrode. A portion of the auxiliary switching magnetic field may pass through the magnetic tunnel junction structure in a direction perpendicular to a direction of the write current through the magnetic tunnel junction structure. Moreover, a magnitude of the write current and/or the auxiliary switching magnetic field may be sufficient to change a program state of the magnetic tunnel junction structure.

The magnetic tunnel junction structure may be on a first portion of the first electrode and a second portion of the first electrode may be free of the magnetic tunnel junction structure. Moreover, the second portion of the first electrode may be electrically connected to a memory cell access transistor so that the first electrode is electrically connected in series between the magnetic tunnel junction structure and the memory cell access transistor. Providing the write current may thus include turning on the memory cell access transistor and providing a write signal to a bit line electrically connected to the second electrode, and the magnetic tunnel junction structure may be electrically connected in series between the bit line and the memory cell access transistor.

The auxiliary switching magnetic field may be an easy magnetization field relative to the magnetic tunnel junction structure. Moreover, the write current may flow through a portion of the first electrode in a direction perpendicular with respect to an easy magnetization axis of the magnetic tunnel junction structure.

The magnetic tunnel junction structure may include a pinned layer, a free layer, and a tunneling insulating layer between the pinned and free layers. When the write current flows in a direction from the free layer through the tunneling insulating layer to the pinned layer, a magnetic polarization of the free layer may be arranged parallel with respect to a magnetic polarization of the pinned layer responsive to the write current. When the write current flows in a direction from the pinned layer through the tunneling insulating layer to the free layer, a magnetic polarization of the free layer may be arranged non-parallel with respect to a magnetic polarization of the pinned layer responsive to the write current.

The auxiliary switching magnetic field may be a hard magnetization field relative to the magnetic tunnel junction structure. Accordingly, the write current may flow through a portion of the first electrode in a direction parallel with respect to an easy magnetization axis of the magnetic tunnel junction structure.

The magnetic random access memory device may include a bit line electrically connected to the second electrode so that the magnetic tunnel junction structure is electrically connected in series between the bit line and the first electrode. Providing the write current may include providing the write current through the bit line, and a bit line magnetic field may be generated by the write current through the bit line. Moreover, a portion of the bit line magnetic field may pass through the magnetic tunnel junction structure, and a magnitude of the write current, a magnitude of the auxiliary switching magnetic field, and/or a magnitude of the bit line magnetic field may be sufficient to change a program state of the magnetic tunnel junction structure. The bit line may be parallel or perpendicular with respect to an easy magnetization axis of the magnetic tunnel junction structure.

The magnetic tunnel junction structure may be on a first portion of the first electrode and a second portion of the first electrode may be free of the magnetic tunnel junction structure. The second portion of the first electrode may be electrically connected to a memory cell access transistor so that the first electrode is electrically connected in series between the magnetic tunnel junction structure and the memory cell access transistor.

The second portion of the first electrode may extend from the magnetic tunnel junction structure in a direction parallel with respect to the bit line. The write current may flow through the bit line in a first direction and through the second portion of the first electrode in a second direction, and the first direction may be opposite the second direction. In other embodiments, the second portion of the first electrode may extend from the magnetic tunnel junction structure in a direction perpendicular with respect to the bit line.

In addition, a read signal may be provided through the magnetic tunnel junction structure, and a magnitude of the read signal may be insufficient to change a program state of the magnetic tunnel junction structure. A program state of the magnetic tunnel junction structure may thus be determined responsive to the read signal.

The first electrode may include a cladding layer and a conductive layer with the conductive layer between the magnetic tunnel junction structure and the cladding layer. In addition, the cladding layer may be on a surface of the conductive layer opposite the magnetic tunnel junction structure and on sidewalls of the conductive layer. The cladding layer may include at least one of a ferromagnetic layer, a nickel-iron layer, a nickel-iron-cobalt layer, and/or a cobalt-iron layer. In addition, the magnetic tunnel junction structure may include a pinned layer, a free layer, and a tunneling insulating layer between the pinned and free layers, and the pinned layer may be a single ferromagnetic layer or a synthetic anti-ferromagnetic layer. Moreover, the free layer may be a single ferromagnetic layer or a synthetic anti-ferromagnetic layer.

According to additional embodiments of the present invention, a magnetic random access memory (MRAM) device may include a memory cell access transistor on a substrate, and an electrode spaced apart from the substrate. A magnetic tunnel junction structure may be provided on a first portion of the electrode with a second portion of the electrode being free of the magnetic tunnel junction structure. In addition, the second portion of the electrode may be electrically connected to the memory cell access transistor so that the electrode is electrically connected between the magnetic tunnel junction structure and the memory cell access transistor. A bit line may be provided on the magnetic tunnel junction structure so that the magnetic tunnel junction structure is electrically connected in series between the bit line and the electrode.

In addition, a controller may be electrically connected to the memory cell access transistor and the bit line. The controller may be configured to providing a write current through the electrode, through the magnetic tunnel junction structure, and through the bit line, and an auxiliary switching magnetic field may be generated by the write current through the electrode. A portion of the auxiliary switching magnetic field may pass through the magnetic tunnel junction structure in a direction perpendicular to a direction of the write current through the magnetic tunnel junction structure, and a magnitude of the write current and/or the auxiliary switching magnetic field may be sufficient to change a program state of the magnetic tunnel junction structure.

According to yet additional embodiments of the present invention, a magnetic random access memory (MRAM) device may include a memory cell access transistor on a substrate, and an insulating layer on the memory cell access transistor and on the substrate. A conductive plug may be provided through the insulating layer and electrically connected to a source/drain region of the memory cell access transistor. An electrode may be provided on the insulating layer and on the conductive plug, and the electrode may include a cladding layer and a conductive layer with the cladding layer between the conductive layer and the substrate. A magnetic tunnel junction structure may be provided on a first portion of the electrode, and a second portion of the electrode may be free of the magnetic tunnel junction structure. Moreover, the second portion of the electrode may be electrically connected to the memory cell access transistor through the conductive plug. In addition, a bit line may be electrically connected to the magnetic tunnel junction structure so that the magnetic tunnel junction structure is electrically connected in series between the bit line and the electrode.

Some embodiments of the present invention may provide methods of operating MRAM devices with reduced write currents. Other embodiments of the present invention may provide methods of operating MRAM devices having increased integration densities.

According to some embodiments of the present invention, operating methods may be provided for programming and reading magnetic random access memory (MRAM) devices including a magnetic tunnel junction (MTJ) structure provided between top and bottom electrodes. The programming method may include forcing a write current through the MTJ structure. The write current may be a positive write current flowing from a free layer to a pinned layer of the MTJ structure, or a negative write current flowing from the pinned layer to the free layer of the MTJ structure. The write current may generate an auxiliary switching magnetic field through the MTJ structure while the write current flows through the bottom electrode, to thereby arrange magnetic polarizations in the free layer to be parallel or antiparallel with respect to magnetic polarizations in the pinned layer.

In some embodiments, the bottom electrode may have an overlapping part that overlaps the MTJ structure, and an extending part that extends from the overlapping part. The extending part may be electrically connected to an access device. The auxiliary switching magnetic field may be generated through the MTJ structure while the write current flows through the bottom electrode.

In other embodiments, forcing the write current may include turning on the access device, and applying a writing signal to a bit line electrically connected to the top electrode. In this case, the positive or negative write current may flow through the MTJ structure and the access device connected thereto.

In still other embodiments, the auxiliary switching magnetic field may be an easy magnetization field. In this case, the write current may flow in a direction perpendicular to an easy magnetization axis of the MTJ structure in the bottom electrode. In addition, when the write current is a positive write current, the positive write current may arrange the magnetic polarizations in the free layer to be parallel with respect to the magnetic polarizations in the pinned layer while the positive write current flows through the bottom electrode. When the write current is a negative write current, the negative write current may arrange the magnetic polarizations in the free layer to be antiparallel with respect to the magnetic polarizations in the pinned layer while the negative write current flows through the bottom electrode.

In yet other embodiments, the auxiliary switching magnetic field may be a hard magnetization field. In this case, the write current may flow in a direction parallel to the easy magnetization axis of the MTJ structure in the bottom electrode.

In yet other embodiments, the write current may apply a bit line magnetic field to the MTJ structure while the write current flows through a bit line connected to the top electrode. In this case, the bit line may be arranged perpendicular or parallel with respect to the easy magnetization axis of the MTJ structure. When the bit line is arranged parallel with respect to a direction extending from the bottom electrode, the direction of the write current flowing through the bit line may be opposite the direction of the write current flowing through the bottom electrode.

In yet other embodiments, the reading method may include applying a read voltage between the bottom and top electrodes to detect an amount of a read current flowing through the MTJ structure.

In yet other embodiments, the bottom electrode may include a cladding layer and an upper conductive layer, which are deposited sequentially. In this case, the cladding layer may extend to surround a sidewall of the upper conductive layer. The cladding layer may be a ferromagnetic layer such as a nickel-iron layer, a nickel-iron-cobalt layer, and/or a cobalt-iron layer.

BRIEF DESCRIPTION OF THE DRAWINGS

FIG. 1A is a plan view of an MRAM memory cell suitable for the application of writing methods according to embodiments of the present invention.

FIG. 2A is a plan view of another MRAM memory cell suitable for the application of writing methods according to embodiments of the present invention.

FIG. 3A is a plan view of still another MRAM memory cell suitable for the application of writing methods according to embodiments of the present invention.

FIG. 4A is a plan view of yet another MRAM memory cell suitable for the application of writing methods according to embodiments of the present invention.

DETAILED DESCRPTION

Figure 1B:
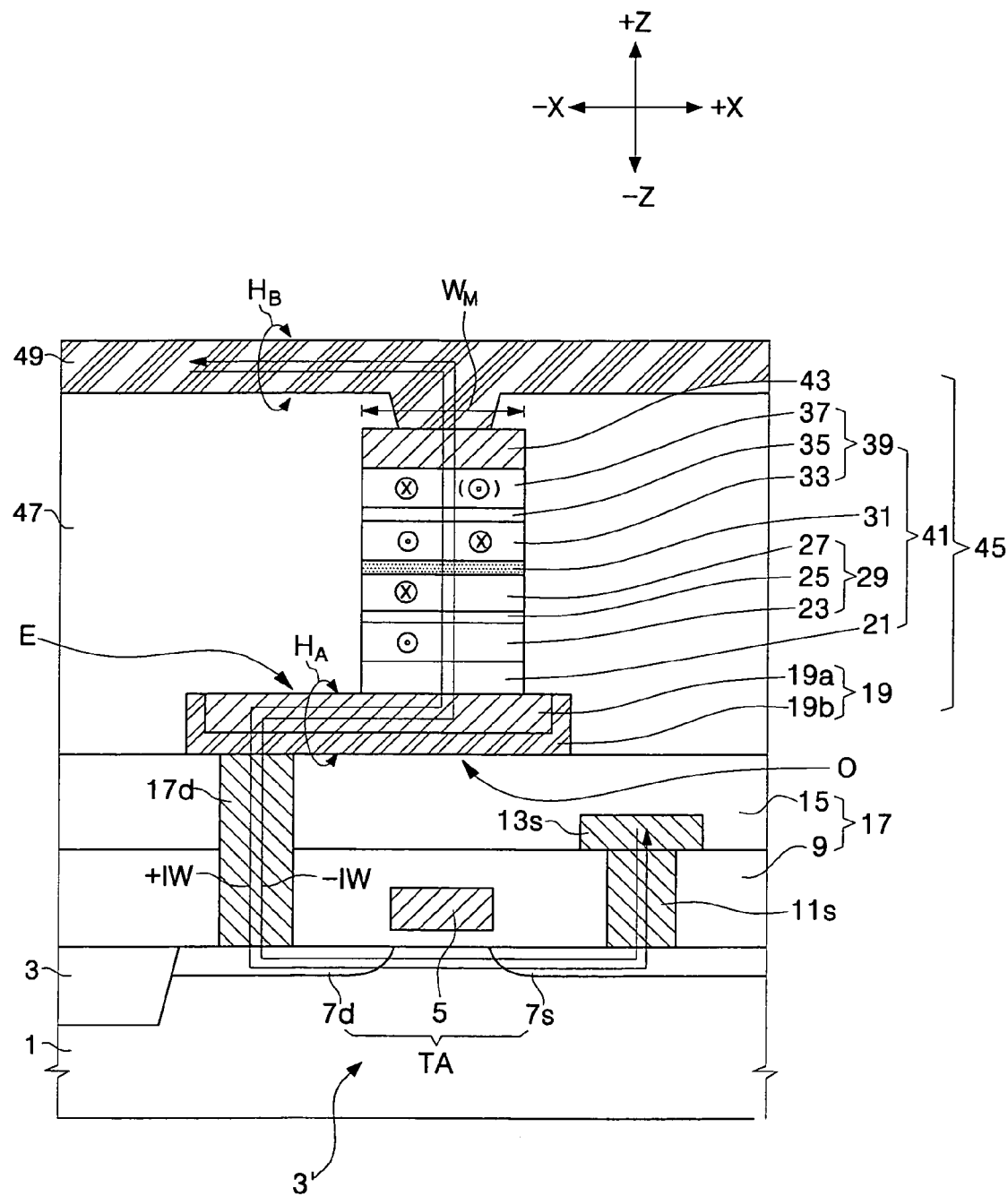
FIG. 1B is a cross-sectional view taken along line I-I' of FIG. 1A.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a plan view of an MRAM cell suitable for application of writing methods according to embodiments of the present invention, and FIG. 1B is a cross-sectional view taken along line I-I' of FIG. 1A.

Referring to FIGS. 1A and 1B, an isolation layer 3 is provided in a region of an integrated circuit substrate 1 to define an active region 3'. A drain region 7d and a source region 7s (which are separated by a channel region) are provided in the active region 3'. A gate electrode 5 is provided on the channel region between the drain and source regions 7d and 7s. The gate electrode 5 may extend to cross the active region 3' to act as a word line 6. As a result, an access MOS transistor TA is provided in the active region 3' as a memory cell access device. In this case, the memory cell access MOS transistor TA includes the drain and source regions 7d and 7s, and the word line 6 (shown as gate electrode 5 in FIG. 1B).

A first lower interlayer insulating layer 9 is provided on the substrate including the memory cell access MOS transistor TA. The source region 7s is electrically connected to a source contact plug 11s passing through the first lower interlayer insulating layer 9. The source contact plug 11s is covered with a source line 13s crossing the active region 3'. As a result, the source line 13s is electrically connected to the source region 7s through the source contact plug 11s.

A first upper interlayer insulating layer 15 is provided on the substrate including the source line 13s. The first lower and upper interlayer insulating layers 9 and 15 provide a first interlayer insulating layer 17. The drain region 7d is electrically connected to a bottom electrode contact plug 17d passing through the first interlayer insulating layer 17.

A magnetic resistor 45 covering the bottom electrode contact plug 17d is provided on the first interlayer insulating layer 17. The magnetic resistor 45 includes a top electrode 43, a bottom electrode 19, and a magnetic tunnel junction (MTJ) structure 41 between the electrodes. The bottom electrode 19 includes an overlapping part O overlapping the MTJ structure 41, and an extending part E horizontally extending from the overlapping part O. Stated in other words, the bottom electrode 19 has a planar area larger than that of the MTJ structure 41 in a dimension parallel with respect to a surface of the substrate 1. The MTJ structure 41 may be provided adjacent one end of the bottom electrode 19, and the extending part E may extend away from the MTJ structure 41 in a longitudinal direction $L_M$ or a lateral direction $W_M$ of the MTJ structure 41. In the example of FIG. 1A, the bottom electrode 19 extends in the lateral direction $W_M$ of the MTJ structure 41. A lower surface of the extending part E is connected to the bottom electrode contact plug 17d. As a result, the bottom electrode 19 is provided between the bottom electrode contact plug 17d and the MTJ structure 41 to form an off-axis structure. Therefore, during driving of the MRAM device, current flowing through the bottom electrode 19 may have a direction perpendicular to the height of the MTJ structure 41. As shown in FIG. 1B, when the MTJ structure 41 has a height in a +z axis direction, current flowing through the bottom electrode 19 may have a −x or +x axis direction. During a writing operation for the MRAM device, a write current flowing through the bottom electrode 19 may generate an auxiliary switching magnetic field for the MTJ structure 41.

The bottom electrode 19 may include a cladding layer 19b and an upper conductive layer 19a, which are deposited sequentially. In this case, the cladding layer 19b may reduce a total magnetic flux path around the upper conductive layer 19a to increase efficiency of the auxiliary switching magnetic field. The cladding layer 19b may be in contact with a lower surface of the upper conductive layer 19a and may extend to cover sidewalls of the upper conductive layer 19a.

When the bottom electrode 19 includes the cladding layer 19b and the upper conductive layer 19a as described above, the bottom electrode 19 may be formed using deposition and patterning processes. Furthermore, a damascene process may be used to form the cladding layer 19b on the lower surface and sidewalls of the upper conductive layer 19a. The upper conductive layer 19a may be a Ti layer, a TiN layer, and/or a laminate thereof. In addition, the cladding layer 19b may be a ferromagnetic layer such as a NiFe layer, a NiCoFe layer, and/or a CoFe layer.

The MTJ structure 41 may include a pinned layer 29, a free layer 39, and a tunneling insulating layer 31 therebetween. In addition, the MTJ structure 41 may include a pinning layer 21 in contact with the pinned layer 29.

The free layer 39 may be a single ferromagnetic layer or a synthetic anti-ferromagnetic (SAF) layer including a lower ferromagnetic layer 33, an anti-ferromagnetic coupling spacer layer 35, and an upper ferromagnetic layer 37, which are sequentially deposited as shown in FIG. 1B. In addition, the pinned layer 29 may be a single ferromagnetic layer or a synthetic anti-ferromagnetic (SAF) layer including a lower ferromagnetic layer 23, an anti-ferromagnetic coupling spacer layer 25, and an upper ferromagnetic layer 27, which are sequentially deposited as shown in FIG. 1B. The top electrode 43 may include a Ti layer, a TiN layer, and/or a laminate thereof (similar to the upper conductive layer 19a). When viewed from the plan view of FIG. 1, the MTJ structure 41 may have a rectangular or elliptical shape having a length $L_M$ and a width $W_M$ less than the length $L_M$. In this case, the MTJ structure 41 may have an easy magnetization axis in the direction of the length $L_M$, and a hard magnetization axis in the direction of the width $W_M$.

A second interlayer insulating layer 47 may be formed to cover the magnetic resistor 45 and the first interlayer insulating layer 17. The top electrode 43 of the magnetic resistor 45 is electrically connected to a bit line 49 formed on the second interlayer insulating layer 47. The bit line 49 may be parallel with respect to the direction of the width $W_M$ of the MTJ structure 41. That is, the bit line 49 may cross the word line 6, and may be parallel with respect to a direction extending from the bottom electrode 19 and the direction of the width $W_M$ of the MTJ structure 41.

In addition, a controller 50 may be electrically coupled to the word line 6 (and gate electrode 5) and to the bit line 49. The controller may thus generate bit line signals, word line signals, write signals, word line voltages, write currents, program voltages, read signals, read voltages, etc. used during write and/or read operations as discussed in greater detail below. The controller 50 may be implemented using electronic elements (such as transistors, diodes, resistors, capacitors, inductors, etc.) provided on portions of the substrate 1 not shown in FIG. 1B.

Hereinafter, a programming (writing) method for an MRAM device according to embodiments of the present invention will be described with reference to FIGS. 1A and 1B. First and second writing signals (i.e., a word line signal and a writing signal) are applied to the word line 6 and the bit line 49, respectively. The word line signal may be a voltage pulse signal having a word line voltage higher than a threshold voltage of the memory cell access MOS transistor TA for a period of time. Therefore, the access MOS transistor TA connected to the word line is turned on during application of the word line voltage. In addition, the writing signal may be a current pulse signal forcing a current through the bit line 49 during application of the word line signal. As a result, the write current passes through the bit line 49, the MTJ structure 41, the bottom electrode 19, and the memory cell access MOS transistor TA connected in series with the bottom electrode 19.

The write current may be a positive write current +IW flowing from the free layer 39 to the pinned layer 29 of the MTJ structure 41, or a negative write current −IW flowing from the pinned layer 29 to the free layer 39. In embodiments, of FIG. 1B, the positive write current +IW flows in a negative z-axis direction through the MTJ structure 41, and the negative write current −IW flows in a positive z-axis direction through the MTJ structure 41. In other words, when the positive write current +IW flows, electrons flow in the positive z-axis direction. When the negative write current flows, the electrons flow in the negative z-axis direction.

When the source line 13s is grounded during a writing operation, the positive write current +IW may be generated by applying a first positive program voltage +VP1 to the bit line 49. When the source line 13s is grounded during the writing operation, the negative write current −IW1 may be generated by applying a first negative program voltage −VP1 to the bit line 49.

When the positive write current +IW1 flows through the MTJ structure 41, most electrons passing through the pinned layer 29 may be varied to have a spin with the same magnetization direction as fixed magnetic polarizations in the pinned layer 29. For example, when a majority of magnetic polarizations in the pinned layer 29 have an up-spin, most electrons passing the pinned layer 29 may be varied to have the up-spin. In particular, when the pinned layer 29 is a synthetic anti-ferromagnetic layer as described above, a majority of electrons reaching the free layer 39 may be varied to have a spin with the same magnetization direction as the upper ferromagnetic layer 27 of the SAF pinned layer. The up-spin electrons thus pass through the tunneling insulating layer 31 to arrive at the free layer 39 so that a magnetization direction of the free layer 39 is now parallel with respect to that of the pinned layer 29. Because the free layer 39 has a majority of magnetic polarizations parallel with respect to the fixed magnetic polarizations in the pinned layer 29 (regardless of an initial magnetization direction of the free layer), the MTJ structure 41 may be switched to have a relatively low resistance value.

The positive write current +IW passes through the MTJ structure 41 and through the bottom electrode 19. The positive write current +IW may thus generate an auxiliary switching magnetic field $H_A$ through the MTJ structure 41 while flowing through the bottom electrode 19 because the bottom electrode 19 has the extending part E which does not overlap the MTJ structure 41. As described above, the bottom electrode 19 is provided between the MTJ structure 41 and the bottom electrode contact plug 17d which is connected to the access transistor TA to provide an off-axis structure. As a result, the current flowing through the bottom electrode 19 may generate the auxiliary switching magnetic field $H_A$ through the MTJ structure 41.

As shown in FIGS. 1A and 1B, when an extended direction of the bottom electrode 19 is perpendicular with respect to a direction of the length $L_M$ of the MTJ structure 41 (i.e., when the positive write current +IW flowing through the bottom electrode 19 is perpendicular with respect to the easy magnetization axis of the MTJ structure 41), the auxiliary switching magnetic field $H_A$ is an easy magnetization field generated in an easy magnetization axis direction of the MTJ structure 41. As described above, the positive write current +IW may cause the magnetic polarizations in the free layer 39 to be arranged parallel with respect to the magnetic polarizations in the pinned layer 29. Accordingly, the positive write current +IW may arrange the magnetic polarizations in the free layer 39 in a direction parallel with respect to the magnetic polarizations in the pinned layer 29 while flowing through the bottom electrode 19. That is, while the positive write current +IW flows through the bottom electrode 19, the auxiliary switching magnetic field $H_A$ generated through the MTJ structure 41 may have the same direction as the magnetic polarizations in the pinned layer 29.

In addition, the positive write current +IW may flow through the bit line 49 before passing through the MTJ structure 41. The positive write current +IW may generate a bit line magnetic field $H_B$ through the MTJ structure 41 while flowing through the bit line 49. As shown in FIGS. 1A and 1B, when the bit line 49 is perpendicular with respect to the direction of the length $L_M$ of the MTJ structure 41, the bit line magnetic field $H_B$ is an easy magnetization field. The auxiliary switching magnetic field $H_A$ and the bit line magnetic field $H_B$ may thus be generated in a same direction through the MTJ structure 41. As shown in FIGS. 1A and 1B, when the bit line 49 and the bottom electrode 19 are provided at upper and lower parts of the MTJ structure 41, respectively, and the extending direction of the bottom electrode 19 and the bit line 49 are parallel with respect to each other, the direction of the positive write current +IW flowing through the bit line 49 may be opposite the direction of the positive write current flowing through the bottom electrode 19.

When the negative write current −IW flows through the MTJ structure 41, electrons are injected into the free layer 39, and the electrons include up-spin electrons and down-spin electrons. When a majority of the fixed magnetic polarizations in the pinned layer 29 have the up-spin, primarily only the up-spin electrons injected into the free layer 39 pass through the tunneling insulating layer 31a to the pinned layer 29, and the down-spin electrons injected into the free layer 39 may accumulate in the free layer 39. As a result, the free layer 39 may have a majority of magnetic polarizations antiparallel with respect to the magnetization direction of the pinned layer 29 (regardless of an initial magnetization direction of the free layer), so that the MTJ structure 41 may be switched to have a relatively high resistance value.

The negative write current −IW flows through the bottom electrode 19 in a direction opposite to the positive write current +IW, and it passes through the MTJ structure 41. The negative write current −IW generates the auxiliary switching magnetic field $H_A$ through the MTJ structure 41 while flowing through the bottom electrode 19. Similar to the magnetic field resulting from the positive write current +IW, the auxiliary switching magnetic field $H_A$ induced by the negative write current −IW may also be an easy magnetization field.

As described above, the negative write current −IW may cause a majority of the magnetic polarizations in the free layer 39 to be arranged antiparallel with respect to the magnetic polarizations in the pinned layer 29. The negative write current −IW may arrange the magnetic polarizations in the free layer 39 in a direction antiparallel with respect to the magnetic polarizations in the pinned layer 29 while flowing through the bottom electrode 19. That is, while the negative write current −IW flows through the bottom electrode 19, the auxiliary switching magnetic field $H_A$ generated through the MTJ structure 41 may have a direction opposite to the direction of the magnetic polarizations in the pinned layer 29.

In addition, the negative write current −IW may generate a bit line magnetic field $H_B$ through the MTJ structure 41 while flowing through the bit line 49. As described above, the auxiliary switching magnetic field $H_A$ and the bit line magnetic field $H_B$ may be generated in a same direction through the MTJ structure 41. That is, the direction of the negative write current −IW flowing through the bit line 49 may be opposite the direction of the negative write current flowing through the bottom electrode 19.

A write current larger than a critical value may be required to switch an MRAM cell using a spin injection mechanism. In accordance with embodiments of the present invention, the write current used to program the MRAM cell may be reduced by using the auxiliary switching magnetic field $H_A$ induced while the write current flows through the bottom electrode 19 and the bit line magnetic field $H_B$ induced while the write current flows through the bit line 49 together with the spin injection mechanism using the write current passing through the MTJ structure 41. In addition, a digit line used in some MRAM devices may be omitted to reduce a write disturbance due to the digit line and/or to increase cell integration density. Further, the bottom electrode 19 may be located more closely adjacent to the MTJ structure 41 than a digit line and may have a thickness less than that of the digit line so that the auxiliary switching magnetic field $H_A$ may provide improved field efficiency.

A method of reading data stored in the MTJ structure 41 may be performed by applying a read voltage $V_R$ across the MTJ structure 41 (i.e., across the bottom and top electrodes 19 and 43). For example, a word line voltage may be applied to the word line 6 to turn on the access MOS transistors TA connected to the word line 6, and a ground voltage and the read voltage $V_R$ may be respectively applied to the source line 13s and the bit line 49. As a result, a read current may flow through the MTJ structure 41, and data of the MRAM cell may be determined as a logical value of "0" or "1" depending on a magnitude of the read current. In this case, the read voltage may have a sufficiently low voltage so that the read current is less than the write current and so that data of the MRAM cell does not change during the read operation.

Figure 2B:
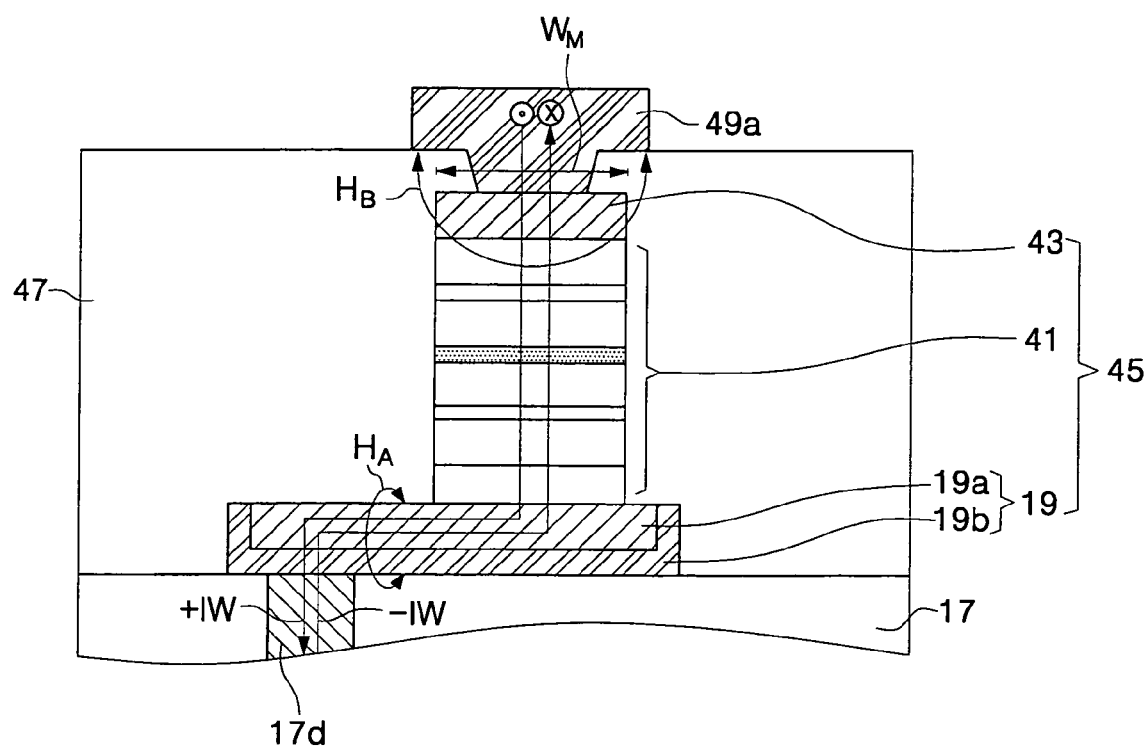
FIG. 2B is a cross-sectional view taken along line II-II' of FIG. 2A.

FIG. 2A is a plan view of another MRAM cell suitable for application of writing methods according to embodiments of the present invention, and FIG. 2B is a cross-sectional view taken along line II-II' of FIG. 2A. Referring to FIGS. 2A and 2B, in contrast to the MRAM cell described with reference to FIGS. 1A and 1B, a bit line 49a is provided on an MTJ structure 41 parallel with respect to the direction of the length $L_M$ of the MTJ structure 41. That is, the bit line 49a is perpendicular with respect to the extended direction (i.e., the x-axis direction) of a bottom electrode 19 and parallel with respect to a word line 6. In this case, an auxiliary switching magnetic field $H_A$ generated through the MTJ structure 41 by the write current flowing through the bottom electrode 19 may be an easy magnetization field, and a bit line magnetic field $H_B$ generated through the MTJ structure 41 by the write current flowing through the bit line 49a may be a hard magnetization field.

In addition, a controller 50 may be electrically coupled to the word line 6 and to the bit line 49a. The controller 50 may thus generate word line signals, bit line signals, write signals, word line voltages, write currents, program voltages, read signals, read voltages, etc. used during write and/or read operations. The controller 50 may be implemented using electronic elements (such as transistors, diodes, resistors, capacitors, inductors, etc.) provided on portions of a substrate not shown in FIG. 2B.

Figure 3B:
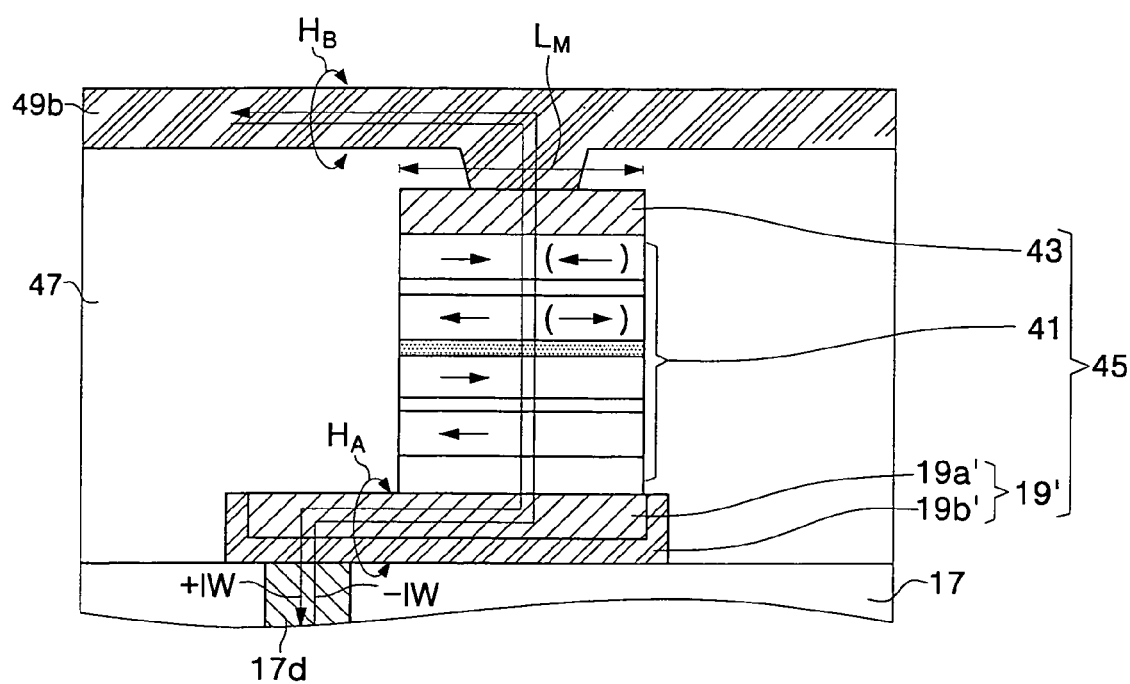
FIG. 3B is a cross-sectional view taken along line III-III' of FIG. 3A.

FIG. 3A is a plan view of still another MRAM cell suitable for application of writing methods according to embodiments of the present invention, and FIG. 3B is a cross-sectional view taken along line III-III' of FIG. 3A. Referring to FIGS. 3A and 3B, a bottom electrode 19' has an extended portion E extending in the direction of the length $L_M$ of an MTJ structure 41. That is, the bottom electrode 19' extends in a direction parallel with respect to the easy magnetization axis of the MTJ structure 41. The bottom electrode 19' may include a cladding layer 19b' and an upper conductive layer 19a', as described with reference to FIGS. 1A and 1B. A bit line 49b is also provided on the MTJ structure 41 parallel with respect to the direction of the length $L_M$ of the MTJ structure 41. As a result, the bit line 49b is provided parallel with respect to the extended direction of the bottom electrode 19' (i.e., in the x-axis direction). In this case, an auxiliary switching magnetic field $H_A$ generated through the MTJ structure 41 by the write current flowing through the bottom electrode 19' may be a hard magnetization field, and a bit line magnetic field $H_B$ generated through the MTJ structure 41 by the write current flowing through the bit line 49b may also be a hard magnetization field. As described with reference to FIGS. 1A and 1B, the write current may flow along the bit line 49b and the bottom electrode 19' in opposite directions.

In addition, a controller 50 may be electrically coupled to the word line 6 and the bit line 49b. The controller 50 may thus generate word line signals, bit line signals, write signals, word line voltages, write currents, program voltages, read signals, read voltages, etc. used during write and/or read operations. The controller 50 may be implemented using electronic devices (such as transistors, diodes, resistors, capacitors, inductors, etc.) provided on portions of a substrate not shown in FIG. 3B.

Figure 4B:
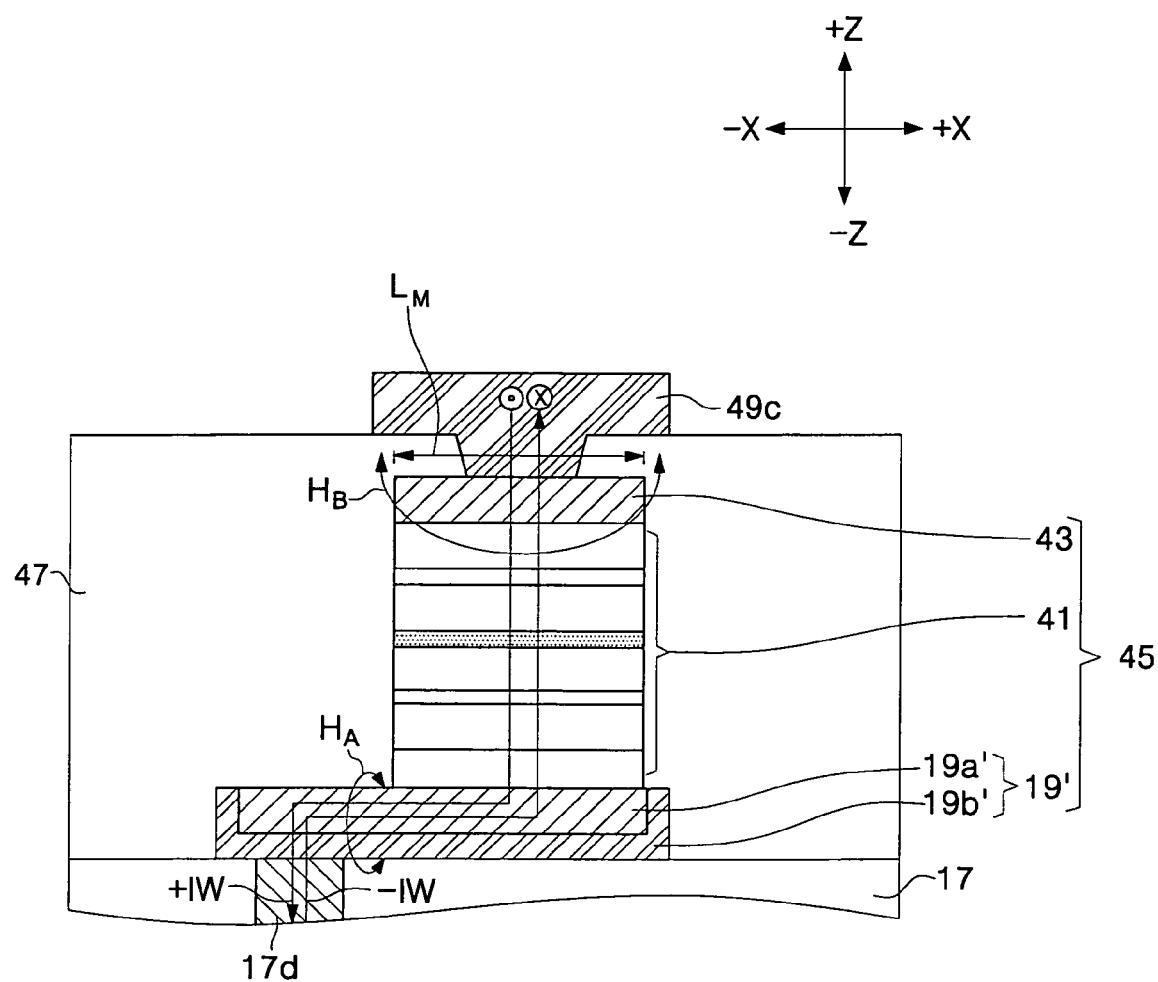
FIG. 4B is a cross-sectional view taken along line IV-IV' of FIG. 4A.

FIG. 4A is a plan view of yet another MRAM cell suitable for application of writing methods according to embodiments of the present invention, and FIG. 4B is a cross-sectional view taken along line IV-IV' of FIG. 4A. Referring to FIGS. 4A and 4B (in contrast to the MRAM cell described with reference to FIGS. 3A and 3B), a bit line 49c is provided on an MTJ structure 41 perpendicular with respect to the direction of the length $L_M$ of the MTJ structure 41 (i.e., parallel with respect to the direction of the width $W_M$ of the MTJ structure 41). That is, the bit line 49c is provided perpendicular with respect to the extended direction of a bottom electrode 19' and parallel to a word line 6. In this case, an auxiliary switching magnetic field $H_A$ generated through the MTJ structure 41 by a write current flowing through the bottom electrode 19' may be a hard magnetization field, and a bit line magnetic field $H_B$ generated through the MTJ structure 41 by the write current flowing through the bit line 49c may be an easy magnetization field.

In addition, a controller 50 may be electrically coupled to the word line 6 and the bit line 49c The controller 50 may thus generate word line signals, bit line signals, write signals, word line voltages, write currents, program voltages, read signals, read voltages, etc. used during write and/or read operations. The controller 50 may be implemented using electronic devices (such as transistors, diodes, resistors, capacitors, inductors, etc.) provided on portions of a substrate not shown in FIG. 4B.

Figure 5:
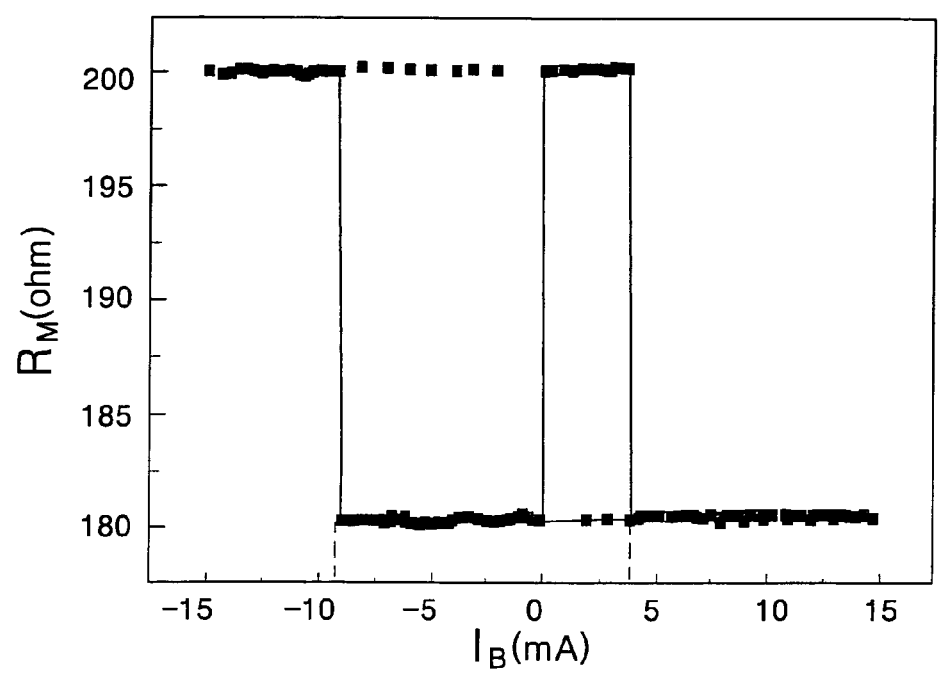
FIG. 5 is a graph illustrating a switching loop of an MRAM cell to which a writing method of a comparative example is applied.
Figure 6:
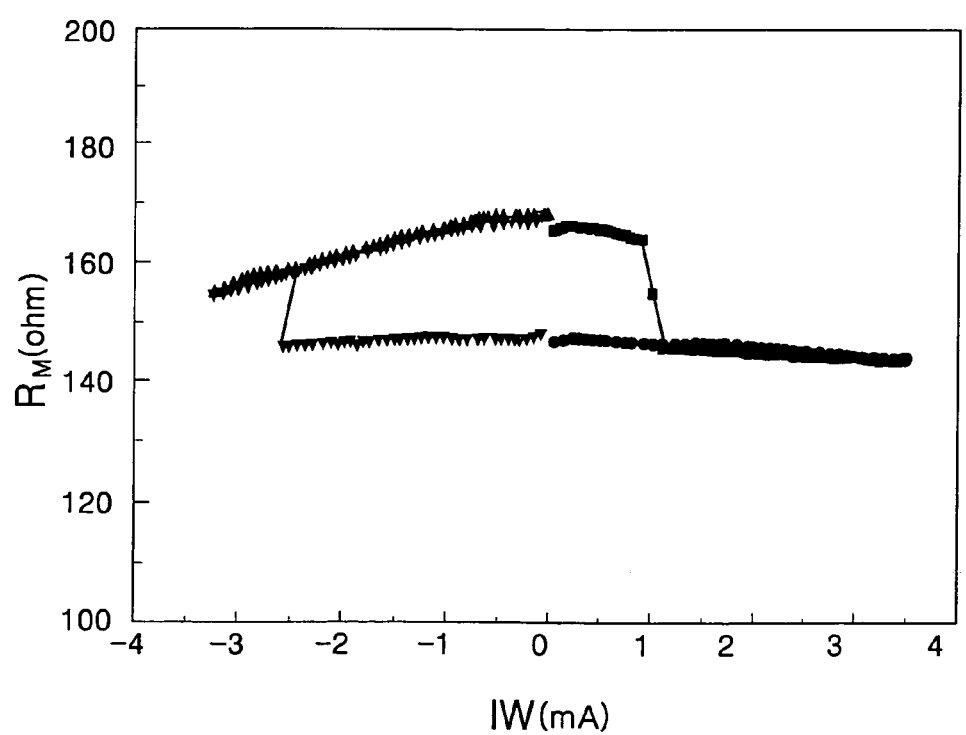
FIG. 6 is a graph illustrating a switching loop of an MRAM cell to which a writing method according to embodiments of the present invention is applied.

FIG. 5 is a graph illustrating a switching loop of an MRAM cell (hereinafter, referred to as a first MRAM cell) to which a writing method of a comparative example is applied. FIG. 6 is a graph illustrating a switching loop of an MRAM cell (hereinafter, referred to as a second MRAM cell) to which a writing method according to embodiments of the present invention is applied In FIG. 5, the x-axis represents a bit line current $I_B$ used to switch an MTJ structure of the first MRAM cell, and the y-axis represents an electrical resistance $R_M$ of the MTJ structure of the first MRAM cell as a function of the bit line current $I_B$. In FIG. 6, the x-axis represents a write current IW used to switch an MTJ structure of the second MRAM cell, and the y-axis represents an electrical resistance $R_M$ of the MTJ structure of the second MRAM cell as a function of the write current IW.

The first MRAM cell includes a digit line and a bit line and an MTJ structure between the digit and bit lines as in the conventional art. The digit line is parallel with respect to a longitudinal direction (i.e., an easy magnetization axis of the MTJ structure), and the bit line is perpendicular with respect to the longitudinal direction of the MTJ structure. FIG. 5 illustrates a result when the MTJ structure is switched by means of only a bit line current (i.e., using only an easy magnetization field induced by the bit line current). On the other hand, the second MRAM cell includes the same structure as described in FIGS. 1A and 1B.

Each of the MTJ structures of the first and second MRAM cells has a width of 0.3 μm (micrometer) and a length of 0.84 μm (micrometer), when viewed from a plan view (i.e., in a plane parallel with respect to a surface of the substrate). In addition, the MTJ structures were formed by sequentially depositing a pinning layer, an SAF pinned layer, a tunneling insulating layer, and an SAF free layer. The pinning layer was formed of a PtMn layer having a thickness of approximately 500 Å (Angstroms), and the SAF pinned layer was formed by sequentially depositing a lower CoFe layer having a thickness of approximately 15 Å (Angstroms), a ruthenium layer having a thickness of approximately 8 Å (Angstroms), and an upper CoFe layer having a thickness of approximately 15 Å (Angstroms). The tunneling insulating layer was formed of an aluminum oxide layer having a thickness of approximately 15 Å (Angstroms), and the SAF free layer was formed by sequentially depositing a lower NiFe layer having a thickness of approximately 30 Å (Angstroms), a ruthenium layer having a thickness of approximately 8 Å (Angstroms), and an upper NiFe layer having a thickness of approximately 15 Å (Angstroms).

Referring simultaneously to FIGS. 5 and 6, the MTJ structure of the first MRAM cell in accordance with the comparative example was switched after showing a lowest resistance of about 180 ohm and a highest resistance of about 200 ohm when the bit line currents $I_B$ are +3.9 mA and −9.1 mA, respectively. The signs + and − used for the bit line current $I_B$ represent directions and/or polarities of the bit line current $I_B$. On the other hand, the MTJ structure of the second MRAM cell in accordance with embodiments of the present invention was switched after showing a lowest resistance of about 145 ohm and a highest resistance of about 160 ohm when the write currents IW are +1.16 mA and −2.59 mA, respectively. The signs + and − used for the write current IW represent directions and/or polarities of the write current IW. That is, the positive write current means a current flowing from the SAF free layer to the SAF pinned layer, and the negative write current means a current flowing from the SAF pinned layer to the SAF free layer. These results indicate that the MRAM cell may be programmed using a smaller write current due to the assistance of the auxiliary switching magnetic field and the bit line magnetic field generated through the MTJ structure of the second MRAM cell while the write current IW flows through the bottom electrode and the bit line, as shown in FIGS. 1A and 1B, together with the spin injection mechanism, when writing methods in accordance with embodiments of the present invention are used.

As can be seen from the foregoing, in accordance with embodiments of the present invention, when switching an MRAM cell using a spin injection mechanism, a magnetic field induced from a write current flowing through a bottom electrode may be used. As a result, it may be possible to reduce a write current used to switch the MRAM cell using assistance of a magnetic field induced by the write current flowing through the bottom electrode. In addition, a write disturbance due to a digit line may be reduced and integration density of the MRAM cell may be increased by eliminating digit lines.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of operating a magnetic random access memory (MRAM) device including a magnetic tunnel junction structure between first and second electrodes, the method comprising:
   providing a write current through the first electrode, through the magnetic tunnel junction structure, and through the second electrode, wherein an auxiliary switching magnetic field is generated by the write current through the first electrode, wherein a portion of the auxiliary switching magnetic field passes through the magnetic tunnel junction structure in a direction perpendicular to a direction of the write current through the magnetic tunnel junction structure, and wherein a magnitude of the write current and/or the auxiliary switching magnetic field is sufficient to change a program state of the magnetic tunnel junction structure.

2. A method according to claim 1 wherein the magnetic tunnel junction structure is on a first portion of the first electrode and a second portion of the first electrode is free of the magnetic tunnel junction structure, and wherein the second portion of the first electrode is electrically connected to a memory cell access transistor so that the first electrode is electrically connected in series between the magnetic tunnel junction structure and the memory cell access transistor.

3. A method according to claim 2 wherein providing the write current comprises turning on the memory cell access transistor and providing a write signal to a bit line electrically connected to the second electrode, wherein the magnetic tunnel junction structure is electrically connected in series between the bit line and the memory cell access transistor.

4. A method according to claim 1 wherein the auxiliary switching magnetic field comprises an easy magnetization field relative to the magnetic tunnel junction structure.

5. A method according to claim 4 wherein the write current flows through a portion of the first electrode in a direction perpendicular with respect to an easy magnetization axis of the magnetic tunnel junction structure.

6. A method according to claim 1 wherein the magnetic tunnel junction structure includes a pinned layer, a free layer, and a tunneling insulating layer between the pinned and free layers, wherein the write current flows in a direction from the free layer through the tunneling insulating layer to the pinned layer so that a magnetic polarization of the free layer is arranged parallel with respect to a magnetic polarization of the pinned layer responsive to the write current.

7. A method according to claim 1 wherein the magnetic tunnel junction structure includes a pinned layer, a free layer, and a tunneling insulating layer between the pinned and free layers, wherein the write current flows in a direction from the pinned layer through the tunneling insulating layer to the free layer so that a magnetic polarization of the free layer is arranged non-parallel with respect to a magnetic polarization of the pinned layer responsive to the write current.

8. A method according to claim 1 wherein the auxiliary switching magnetic field comprises a hard magnetization field relative to the magnetic tunnel junction structure.

9. A method according to claim 8 wherein the wherein the write current flows through a portion of the first electrode in a direction parallel with respect to an easy magnetization axis of the magnetic tunnel junction structure.

10. A method according to claim 1 wherein the magnetic random access memory device includes a bit line electrically connected to the second electrode so that the magnetic tunnel junction structure is electrically connected in series between the bit line and the first electrode, wherein providing the write current comprises providing the write current through the bit line, wherein a bit line magnetic field is generated by the write current through the bit line, wherein a portion of the bit line magnetic field passes through the magnetic tunnel junction structure, and wherein a magnitude of the write current, a magnitude of the auxiliary switching magnetic field, and/or a magnitude of the bit line magnetic field is sufficient to change a program state of the magnetic tunnel junction structure.

11. A method according to claim 10 wherein the bit line is parallel with respect to an easy magnetization axis of the magnetic tunnel junction structure.

12. A method according to claim 10 wherein the bit line is perpendicular with respect to an easy magnetization axis of the magnetic tunnel junction structure.

13. A method according to claim 10 wherein the magnetic tunnel junction structure is on a first portion of the first electrode and a second portion of the first electrode is free of the magnetic tunnel junction structure, and wherein the second portion of the first electrode is electrically connected to a memory cell access transistor so that the first electrode is electrically connected in series between the magnetic tunnel junction structure and the memory cell access transistor.

14. A method according to claim 13 wherein the second portion of the first electrode extends from the magnetic tunnel junction structure in a direction parallel with respect to the bit line.

15. A method according to claim 14 wherein the write current flows through the bit line in a first direction and through the second portion of the first electrode in a second direction, and wherein the first direction is opposite the second direction.

16. A method according to claim 13 wherein the second portion of the first electrode extends from the magnetic tunnel junction structure in a direction perpendicular with respect to the bit line.

17. A method according to claim 1 further comprising:
   providing a read signal through the magnetic tunnel junction structure wherein a magnitude of the read signal is insufficient to change a program state of the magnetic tunnel junction structure; and
   determining a program state of the magnetic tunnel junction structure responsive to the read signal.

18. A method according to claim 1 wherein the first electrode comprises a cladding layer and a conductive layer, wherein the conductive layer is between the magnetic tunnel junction structure and the cladding layer.

19. A method according to claim 18 wherein the cladding layer is on a surface of the conductive layer opposite the magnetic tunnel junction structure and on sidewalls of the conductive layer.

20. A method according to claim 18 wherein the cladding layer comprises at least one of a ferromagnetic layer, a nickel-iron layer, a nickel-iron-cobalt layer, and/or a cobalt-iron layer.

21. A method according to claim 1 wherein the magnetic tunnel junction structure includes a pinned layer, a free layer, and a tunneling insulating layer between the pinned and free layers, and wherein the pinned layer is a single ferromagnetic layer or a synthetic anti-ferromagnetic layer.

22. A method according to claim 1 wherein the magnetic tunnel junction structure includes a pinned layer, a free layer, and a tunneling insulating layer between the pinned and free layers, and wherein the free layer is a single ferromagnetic layer or a synthetic anti-ferromagnetic layer.

23. A magnetic random access memory (MRAM) device comprising:
a memory cell access transistor on a substrate;
an electrode spaced apart from the substrate;
a magnetic tunnel junction structure on a first portion of the electrode wherein a second portion of the electrode is free of the magnetic tunnel junction structure and wherein the second portion of the electrode is electrically connected to the memory cell access transistor so that the electrode is electrically connected between the magnetic tunnel junction structure and the memory cell access transistor;
a bit line on the magnetic tunnel junction structure so that the magnetic tunnel junction structure is electrically connected in series between the bit line and the electrode; and
a controller electrically connected to the memory cell access transistor and the bit line, wherein the controller is configured to provide a write current through the electrode, through the magnetic tunnel junction structure, and through the bit line, so that an auxiliary switching magnetic field is generated by the write current through the electrode, wherein a portion of the auxiliary switching magnetic field passes through the magnetic tunnel junction structure in a direction perpendicular to a direction of the write current through the magnetic tunnel junction structure, and wherein a magnitude of the write current and/or the auxiliary switching magnetic field is sufficient to change a program state of the magnetic tunnel junction structure.

24. A magnetic random access memory device according to claim 23 wherein the bit line is parallel with respect to an easy magnetization axis of the magnetic tunnel junction structure.

25. A magnetic random access memory device according to claim 23 wherein the bit line is perpendicular with respect to an easy magnetization axis of the magnetic tunnel junction structure.

26. A magnetic random access memory device according to claim 23 wherein the second portion of the electrode extends from the magnetic tunnel junction structure in a direction parallel with respect to the bit line.

27. A magnetic random access memory device according to claim 26 wherein write current flows through the bit line in a first direction and through the second portion of the electrode in a second direction, and wherein the first direction is opposite the second direction.

28. A magnetic random access memory device according to claim 23 wherein the second portion of the electrode extends from the magnetic tunnel junction structure in a direction perpendicular with respect to the bit line.

29. A magnetic random access memory device according to claim 23 wherein the electrode comprises a cladding layer and a conductive layer, wherein the cladding layer is between the conductive layer and the substrate.

30. A magnetic random access memory device according to claim 29 wherein the cladding layer is on sidewalls of the conductive layer.

31. A magnetic random access memory device according to claim 29 wherein the cladding layer comprises at least one of a ferromagnetic layer, a nickel-iron layer, a nickel-iron-cobalt layer, and/or a cobalt-iron layer.

32. A magnetic random access memory (MRAM) device comprising:
a memory cell access transistor on a substrate;
an electrode spaced apart from the substrate;
a magnetic tunnel junction structure on a first portion of the electrode wherein a second portion of the electrode is free of the magnetic tunnel junction structure and wherein the second portion of the electrode is electrically connected to the memory cell access transistor so that the electrode is electrically connected between the magnetic tunnel junction structure and the memory cell access transistor; and
a bit line on the magnetic tunnel junction structure so that the magnetic tunnel junction structure is electrically connected in series between the bit line and the electrode;
wherein the second portion of the electrode extends from the magnetic tunnel junction structure in a direction parallel with respect to the bit line, and wherein write current flows through the bit line in a first direction and through the second portion of the electrode in a second direction, and wherein the first direction is opposite the second direction.

33. A magnetic random access memory (MRAM) device comprising:
a memory cell access transistor on a substrate;
an electrode spaced apart from the substrate;
a magnetic tunnel junction structure on a first portion of the electrode wherein a second portion of the electrode is free of the magnetic tunnel junction structure and wherein the second portion of the electrode is electrically connected to the memory cell access transistor so that the electrode is electrically connected between the magnetic tunnel junction structure and the memory cell access transistor; and
a bit line on the magnetic tunnel junction structure so that the magnetic tunnel junction structure is electrically connected in series between the bit line and the electrode;
wherein the second portion of the electrode extends from the magnetic tunnel junction structure in a direction perpendicular with respect to the bit line.

34. A magnetic random access memory (MRAM) device comprising:
a memory cell access transistor on a substrate;
an electrode spaced apart from the substrate;
a magnetic tunnel junction structure on a first portion of the electrode wherein a second portion of the electrode is free of the magnetic tunnel junction structure and wherein the second portion of the electrode is electrically connected to the memory cell access transistor so that the electrode is electrically connected between the magnetic tunnel junction structure and the memory cell access transistor; and a bit line on the magnetic tunnel junction structure so that the magnetic tunnel junction structure is electrically connected in series between the bit line and the electrode;

wherein the electrode comprises a cladding layer and a conductive layer, wherein the cladding layer is between the conductive layer and the substrate.

35. A magnetic random access memory device according to claim 34 wherein the cladding layer is on sidewalls of the conductive layer.

36. A magnetic random access memory device according to claim 34 wherein the cladding layer comprises at least one of a ferromagnetic layer, a nickel-iron layer, a nickel-iron-cobalt layer, and/or a cobalt-iron layer.

* * * * *